United States Patent [19]

Endoh et al.

[11] 4,270,177

[45] May 26, 1981

[54] DIGITAL AMPLITUDE CONTROL FOR DIGITAL AUDIO SIGNAL

[75] Inventors: Kenjiro Endoh; Yoshiyuki Ishizawa; Masanori Tanaka, all of Yokohama; Koji Iwasaki, Gotenba, all of Japan

[73] Assignee: Tokyo Shibaura Denki Kabushiki Kaisha, Kawasaki, Japan

[21] Appl. No.: 50,215

[22] Filed: Jun. 20, 1979

[51] Int. Cl.³ .............................................. H03G 3/00
[52] U.S. Cl. .................................. 364/571; 364/606; 340/347 CC
[58] Field of Search ............... 364/571, 606, 724, 573, 364/572; 340/347 AD, 347 CC; 360/67; 179/1 D, 1 VL

[56] References Cited

U.S. PATENT DOCUMENTS

| | | | |
|---|---|---|---|
| 3,613,112 | 10/1971 | Kanter | 340/347 CC |
| 3,641,563 | 2/1972 | Cushman et al. | 340/347 CC |
| 3,790,910 | 2/1974 | McCormack | 340/347 CC |
| 3,972,626 | 8/1976 | Laskowsi | 364/571 |
| 4,011,438 | 3/1977 | Aufderheide et al. | 364/724 |
| 4,044,241 | 8/1977 | Hatley, Jr. | 364/724 |
| 4,064,396 | 12/1977 | Panarello | 364/573 |
| 4,159,524 | 6/1979 | Schollmeier et al. | 364/606 |

FOREIGN PATENT DOCUMENTS

| | | |
|---|---|---|
| 1385024 | 2/1975 | United Kingdom . |
| 1410816 | 10/1975 | United Kingdom . |
| 1411788 | 10/1975 | United Kingdom . |
| 1423421 | 2/1976 | United Kingdom . |
| 1490531 | 11/1977 | United Kingdom . |
| 1503797 | 3/1978 | United Kingdom . |

*Primary Examiner*—Charles E. Atkinson
*Assistant Examiner*—Gary Chin
*Attorney, Agent, or Firm*—Oblon, Fisher, Spivak, McClelland & Maier

[57] ABSTRACT

A digital amplitude control apparatus for a digital audio signal in which the output voltage of a linear-type potentiometer or attenuator connected across a DC power supply is converted into a digital signal by an A/D converter, the output voltage being linearly related to the manipulated variable of the slider of the potentiometer, the digital signal is applied as an address signal to a memory which stores in memory locations thereof a series of amplitude control digital values with a desired amplitude changing characteristic, thereby reading out of an accessed location a amplitude control value corresponding to the attenuation set by the potentiometer, and a digitized audio information signal to be amplitude-controlled is multiplied by the amplitude control value read out of the memory by means of a digital multiplier.

9 Claims, 10 Drawing Figures

DIGITAL AMPLITUDE CONTROL FOR DIGITAL AUDIO SIGNAL

This invention relates to a digital amplitude control apparatus suitable for amplitude-control of a digitized audio information signal or the like provided by a method of pulse code modulation (PCM) or the like.

Recently, because of a remarkable enhancement of S/N ratio has attracted special interest a PCM recording system in which audio information is converted into a digital signal and then recorded on a magnetic tape in the form of digital information. Even in the PCM recording system, the amplitude level of the audio information signal is adjusted and this is performed in a digital manner. Referring to FIG. 1 showing a prior art digital amplitude control apparatus, an analog information signal whose amplitude level is to be control is converted into a digital signal by an analog-to-digital (A/D) converter 1. The digital signal is applied to a digital multiplier 2, where it is multiplied by a digital amplitude control value from an A/D converter 3, whereby the amplitude control is accomplished. The input of the A/D converter 3 is coupled to the slider of a nonlinear (log-linear) potentiometer 4 which is connected across a DC power source 5 and whose output voltage logarithm is in proportion to the slider position.

If the dynamic range of the analog information signal (audio signal) applied to the A/D converter 1 is 96 dB, then the digital amplitude control signal necessitates at least 16 bits. In order to achieve high-accuracy amplitude control of the digital audio signal, approximately 16 bits are required also for the digital amplitude control value from the A/D converter 3. An A/D converter for processing many bits such as 16 bits is generally very costly, so that the amplitude control apparatus employing the A/D converter 3 for providing digital amplitude control values would be highly expensive. When used in a multichannel mixing console for the recording studio use, the number of the amplitude control apparatus increases, giving rise to extremely high cost.

In the aforementioned amplitude control apparatus, the log-linear potentiometer or attenuator is used for the amplitude control in agreement with the human auditory sense, and the output voltage of the potentiometer 4 is converted into a digital amplitude control value by the linear A/D converter 3. Since the output voltage of the potentiometer changes nonlinearly with respect to the displacement of the slider, the quantization step size of the slider displacement that changes the least significant bit (LSB) of the output signal of the A/D converter is not uniform throughout the shifting range of the slider. In a low-attenuation range, therefore, there would be performed amplitude control depending on so minute step sizes that are not perceptible by the ear. Such an amplitude control, exhibiting high redundancy, may be regarded as uneconomical.

An object of this invention is to provide an economical digital amplitude control apparatus capable of low-redundancy amplitude control.

Another object of the invention is to provide a digital amplitude control apparatus for a digital audio signal of simple construction capable of high-accuracy, high-stability amplitude control.

According to this invention, there is provided a digital amplitude control apparatus comprising: a manipulatable digital signal generating means for producing a digital signal which is substantially linearly related to a manipulated variable; memory means storing a series of digital amplitude control values with predetermined amplitude changing characteristics in memory locations, and connected to receive as an address signal the digital signal from said digital signal generating means so as to read out stored digital amplitude control value from one of said memory locations designated by the address signal; and digital audio multiplier means multiplying a digital input signal to be amplitude controlled by the digital amplitude control value from said memory means.

In order to achieve high-accuracy amplitude control, the digital audio information signal and the amplitude control value should prefereably have the same number of bits. However, the bit number of the digital memory control signal to access the memory may be smaller than that of the digital audio signal because man's difference limen for change in the loudness may be about 0.25 dB. The digital memory control signal generating means may be formed of a cheap linear-type potentiometer or attenuator and a cheap low-bit A/D converter for converting the output voltage of the potentiometer into a digital signal.

This invention can be more fully understood from the following detailed description when taken in conjunction with the accompanying drawings, in which.

In the following description of an embodiment of this invention, a digitized audio information signal is taken as an example of a digital information signal the amplitude of which is to be controlled. Further, in this embodiment, it is assumed that the audio information signal whose amplitude level is to be adjusted has a dynamic range of 96 dB as stated before, and is digitized into a code of 16 bits. It is further assumed that the digitized audio information signal is amplitude controlled by a potentiometer or attenuator by a constant step of 0.25 dB in the attenuation range from 0 dB to −65 dB and the same quantization step as the audio information signal in the attenuation range from −65 dB to −∞ dB. This is based on the following reason. That is, where an audio information signal is digitized into a 16-bit code, the amplitude resolution of the audio information signal becomes 0.244 dB at −65.204 dB, and thus the amplitude resolution is less than 0.25 dB in the range of 0 dB to −65.204 dB. Accordingly, the amplitude adjustment in about 0.25 dB steps is possible in this range. Since the amplitude resolution of the audio information signal becomes more than 0.25 dB under the attenuation level of −65.204 dB, the amplitude of the audio information signal should be controlled in accordance with the amplitude resolution of the audio information signal. By doing so, in the practical attenuation range from 0 dB to about −65 dB the log-linear amplitude adjustment in 0.25 dB steps is performed and in the range from −65 dB to −∞ dB the log-nonlinear amplitude adjustment is performed. In this case, the number of steps of the amplitude adjuster is 297 in all, 260 in the attenuation range from 0 dB to −65 dB and 37 in the attenuation range from −65 dB to −∞ dB. Thus, 9-bit amplitude control information is required to identify each step. The level difference of 0.25 dB can hardly be heard at loudness with an auditory sensation level less than 80 dB. Therefore, the amplitude adjustment by 0.25 steps from 0 dB to −65 dB can be regarded as to be continuous. In the attenuation range from −65 dB to −∞ dB, since loudness is reduced the difference limen for change in loudness is large and the amplitude-adjusting step may become large by about 1.3 dB at an auditory sensation level of, for example, 20 dB.

Figure 2:
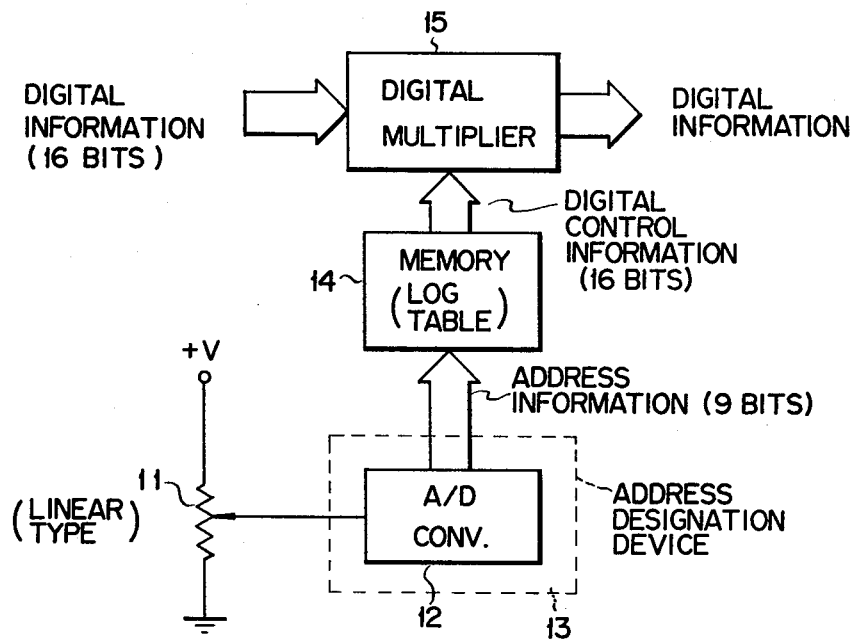
FIG. 2 shows a digital amplitude control adjusting apparatus according to an embodiment of this invention.

Referring now to FIG. 2 showing the basic arrangement of the apparatus of this invention, there is shown a linear potentiometer 11 across which a voltage +V is applied by means of a stabilized DC power source. Thus, the slider output voltage of the potentiometer 11 is linearly related to the manipulated variable, that is, distance of linear movement or angle of rotation of the slider. The output voltage of the potentiometer 11 is applied to an A/D converter 12 forming an address designation device 13, where it is converted into a digital signal. The A/D converter 12 is so designed that the LSB of its output signal may vary when a change of the output voltage of the potentiometer corresponding to 0.25 dB is made in the attenuation range from 0 dB to −65 dB on the graduations representing the slider positions of attenuator 11. The A/D converter 12 provides a 9-bit output to represent 297 steps of the potentiometer 11. The digital output signal of the A/D converter 12 is used as an address signal for a memory 14. The memory 14, which is formed of e.g. a ROM, has at least 297 memory locations. These memory locations store a logarithm table representing 16-bit amplitude control values corresponding to the graduations of the attenuator 11. For example, a control value −0 dB (=1.00000) is stored in a memory location with address 0; −0.25 dB (=0.97163) in a memory location with address 1, −0.50 dB (=0.94406) in a memory location with address 2, −25 dB (=0.05634) in a location with address 100, −65 dB (=0.00050) in a location with address 260, and −∞ dB (=0.00000) in a location with address 296. These control amplitude values are selectively read by the 9-bit address signal from the A/D converter 12 corresponding to the slider position of the potentiometer 11. The 16-bit amplitude control information read out of the memory 14 is multiplied by 16-bit digital audio information in a digital multiplier 15, and the amplitude of the audio information is attenuated by the degree of attenuation set by the attenuator 11.

According to this invention as described above, the use of an expensive log-linear attenuator may be avoided, and a cheap low-bit A/D converter can be used as the A/D converter for processing amplitude control information, so that there may be obtained an economical digital amplitude control apparatus. Moreover, owing to the use of the linear potentiometer, unnecessarily fine amplitude adjustment in a low-attenuation range can be avoided, thereby reducing the redundancy of the amplitude adjustment.

Conventionally, a 50-step attenuator has been used for analog audio signals. To realize the 50-step attenuation in digital manner the number of output bits of the A/D converter 12 may be 6, which enables the use of cheaper one for the A/D converter 12.

The apparatus may be so designed that log-linear and log-nonlinear amplitude adjustments may be performed for attenuation ranges from 0 dB to −40 dB and from less than −40 dB to −∞ dB, respectively, for example. That is, the numbers of steps of amplitude adjustment and the memory locations may be saved by making the log-linear amplitude adjustment only in the mainly used attenuation range.

In order to perform the amplitude adjustment as specified, it is desired that the output signal of the A/D converter 12, that is, the address designation information for the memory 14 be stable or immune to noises which may be applied to the input of the A/D converter 12. Now there will be described the address designation device that meets such a requirement.

Figure 3:
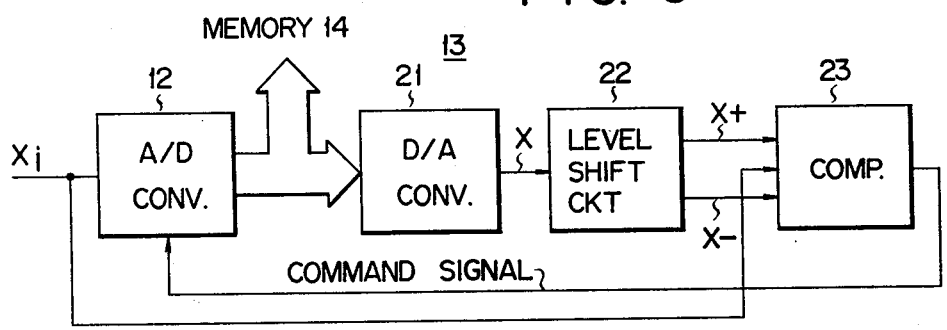
FIGS. 3 and 4 show preferred arrangements of the address designation device as shown in FIG. 2.

Referring now to FIG. 3, an analog input voltage xi from the potentiometer 11 is applied to the A/D converter 12, which produces an address signal for the memory 14 in response to the impression of a command signal as mentioned later. This address signal is applied to a digital-to-analog (D/A) converter 21, which produces an analog signal X corresponding to a digital input signal. The analog signal X is applied to a level shift circuit 22, which produces first and second output voltages X+ and X−. These first and second output voltages X+ and X− are given by $X+ = X + \Delta X$ and $X- = X - \Delta X$, respectively. For example, $\Delta X$ is the quantization step size of A/D converter 12 and may be represented by $X_{FS}/2^N$ where $X_{FS}$ is the maximum allowable input voltage range of the converter 12 and N is the number of output bits. The first and second output voltages X+ and X− are applied to a suitable comparator 23 such as a window comparator, where they are compared with the input voltage xi of the A/D converter 12. The output state of the comparator 23 varies with its input state changing between a first input state, $X- \leq xi \leq X+$, and a second input state, $xi < X-$ or $X+ < xi$. When the input state is changed from the first input state to the second input state, the comparator circuit 23 produces a command signal, whereby the input voltage xi of the A/D converter 12 is converted into a digital signal. Thus, the A/D converter 12 performs a A/D conversion for each application of the command signal, and maintains the previously converted digital signal until a subsequent command signal is applied.

Figure 4:
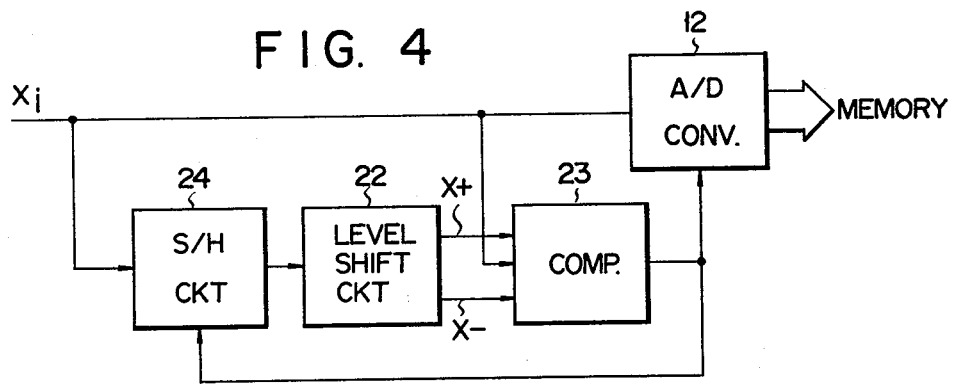

In an embodiment of FIG. 4, the analog input voltage xi is applied to a sample and hold (S/H) circuit 24 and the A/D converter 12 which both respond to the command signal from the comparator circuit 23. The output voltage of the S/H circuit 24 is supplied to the level shift circuit 22.

Figure 5:
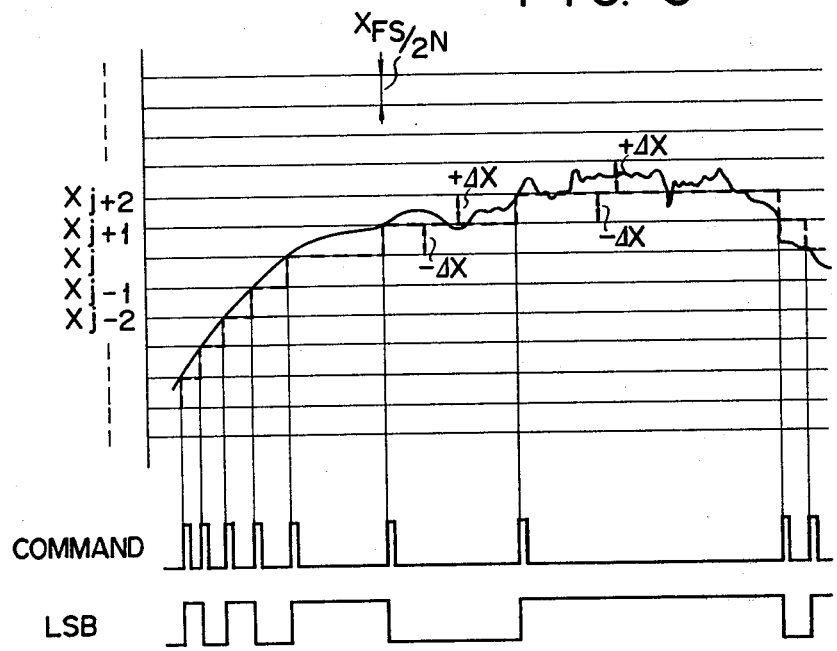
FIG. 5 is a diagram for illustrating the operations of the arrangements of FIGS. 3 and 4.

In the arrangements of FIGS. 3 and 4 when the digital conversion of the input signal xi is perpormed at a quantization level xj, as shown in FIG. 5, the comparator 23 is supplied with the input signal xi, the first output voltage X+ at an upper quantization level xj+1 and the second output voltage X− at a lower quantization level xj−1. Accordingly, even if the analog input voltage xi from the potentiometer 11 is varied by noises within a range of $\pm \Delta X$, the comparator 23 produces no command signal with the result that the output digital signal of A/D converter 12 does not change. As shown in FIG. 5, the command signal is issued for every change of the analog input signal exceeding ΔX and the LSB of the output signal changes due to digital conversion.

Figure 6:
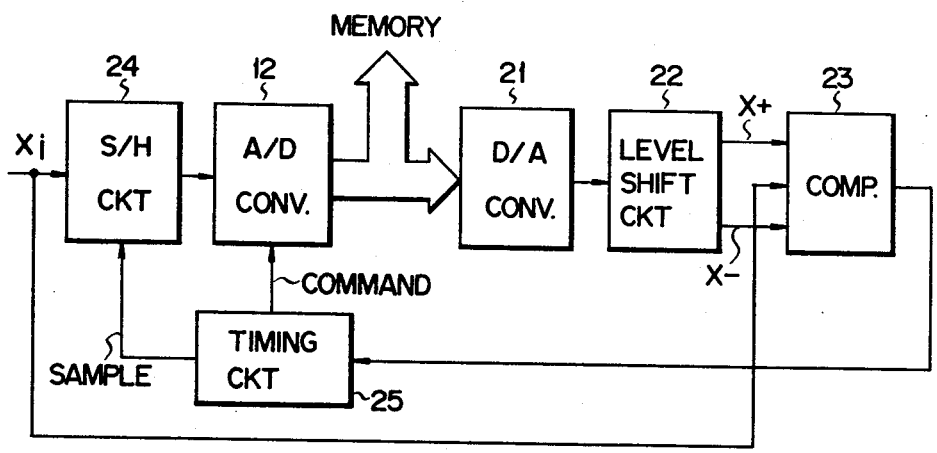
FIGS. 6 and 7 show modifications of the arrangements of FIGS. 3 and 4, respectively.

FIG. 6 shows a modification of the embodiment of FIG. 3, in which the S/H circuit 24 is connected to the input of A/D converter 12 and a timing circuit 25 is provided which issues command and sample signals respectively to the A/D converter 12 and the S/H circuit 24 in response to the output state corresponding to the input state change of the comparator circuit 23.

Figure 7:
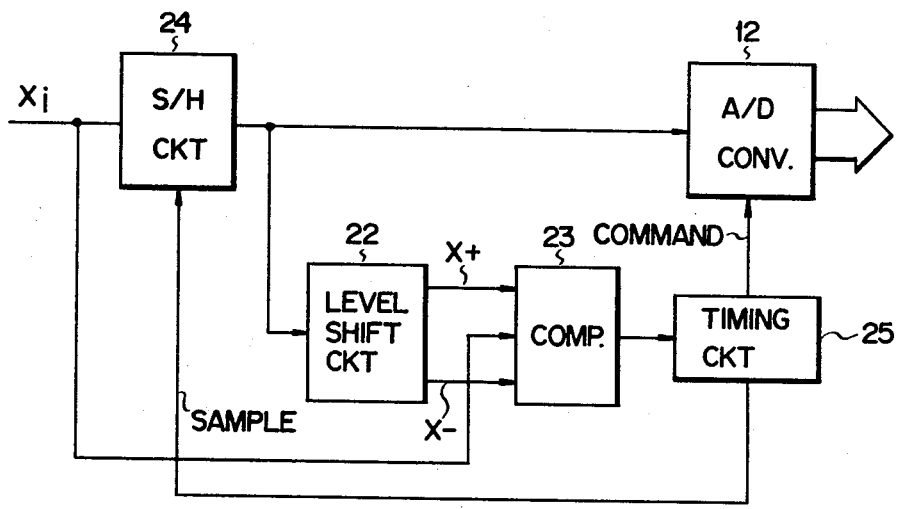

FIG. 7 shows a modification of the embodiment of FIG. 4, in which the S/H circuit 24 is provided at the input side of the A/D converter 12, supplying a sampled analog signal to the A/D converter 12 and the level shift circuit 22, and there is further provided a timing circuit 25 issuing command and sample signals respectively to the A/D converter 12 and the S/H circuit 24 in response to the output state corresponding to the input state change of the comparator circuit 23.

In FIGS. 6 and 7, the timing circuit 25 is provided to cause the S/H circuit 24 to operate prior to the converting operation of the A/D converter 12, thereby digital-converting a newly sampled analog input signal. As the S/H circuit and timing circuit, the circuits may be used which are normally contained in the A/D converter.

Figure 8:
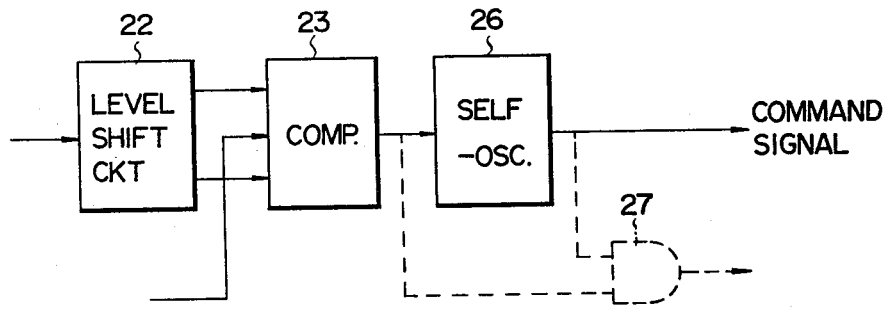
FIG. 8 shows a further modification of the address designation device.

For the production of command signals, there may be provided a self-oscillator 26 which is enabled in the output state corresponding to the second input state of the comparator circuit 23, as shown in FIG. 8. According to such an arrangement, a digital signal based on the attenuation set by the potentiometer 11 may be obtained in a relatively short time even when the slider of the potentiometer 11 is moved over a long distance, that is, when the input voltage xi goes out of the range from X− to X+ upon application of power supply or upon a sudden great change in the output voltage of the potentiometer 11. Alternatively, the command signal may be taken out through an AND gate 27 which is enabled in the output state corresponding to the second input state of the comparator circuit 23.

With the arrangements of FIGS. 3 to 8, the A/D converter has an insensible range of ±ΔX, and thus the output of A/D converter does not change when the change in the input signal xi occurs within the insensible range. That is, the stable A/D conversion is provided which is not affected by variation in the level of input signal xi resulting from change in the power supply voltage, temperature drift of elements used, and induced noise. This is specially effective in the case of stably controlling a high-bit signal by a low-bit signal as in this invention. Although, in the embodiments, ΔX determining the insensible range is set to equal the quantization size, the optimum value of ΔX may be determined depending on the required accuracy of level adjustment and the extent of variation in the amplitude of the input signal xi due to noises.

Figure 9:
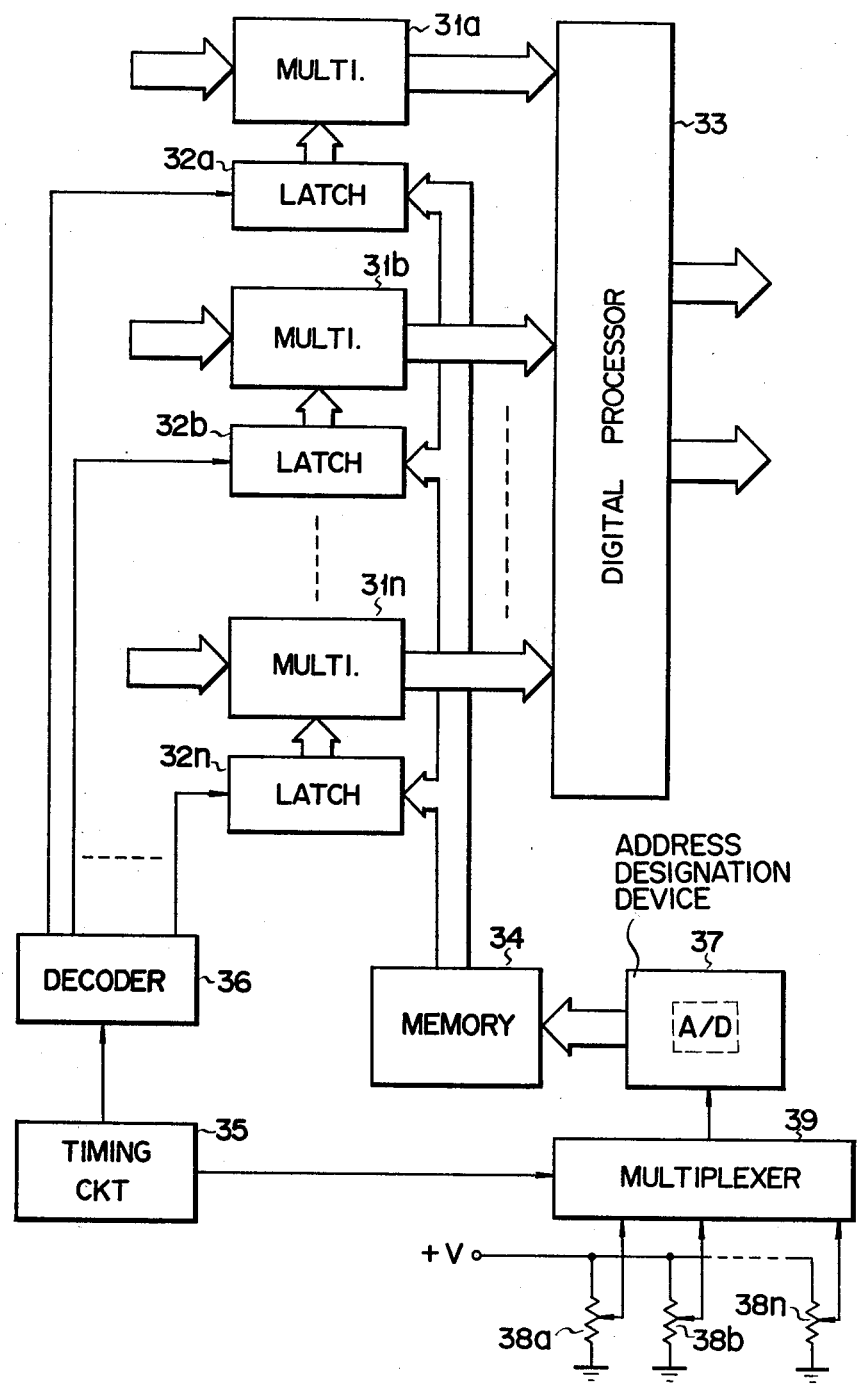
FIG. 9 shows the construction of a mixing console illustrating an applied form of the amplitude control apparatus of the invention.

Referring now to FIG. 9, an applied form of the amplitude adjusting apparatus of this invention will be described taking as an example a mixing console for mixing multichannel signals into two-channel signals. Digital audio signals on multichannels are applied to corresponding digital multipliers 31a to 31n. Latch circuits 32a to 32n are provided correspondingly to the multipliers 31a to 31n. These latch circuits latch and apply digital amplitude control information from a memory 34 to their corresponding multipliers. Amplitude controlled digital signals from the digital multipliers 31a to 31n are applied to a digital signal process circuit 33 which is formed of an output selector for distributing the multichannel signals to two channels, digital filters, digital adders, and digital pan-pots. The latch circuits 32a to 32n are enabled in a time division manner by outputs of a decoder circuit 36 which responds to a timing circuit 35, thereby successively latching control information from the memory 34. There are provided linear attenuators 38a to 38n corresponding to the number of channels, the respective outputs of which are coupled to a multiplexer 39 responsive to the timing circuit 35. The multiplexer 39 supplies level control information set in the attenuators 38a to 38n in the time division manner to an address designation device 37 which includes an A/D converter as a main constituent element thereof as described above. The address designation device 37 designates addresses of the locations of the memory 34 storing the digital amplitude control values corresponding to the amplitude control information from the multiplexer 39. In consequence, digital amplitude control values are successively read out of the designated memory locations.

According to the arrangement of FIG. 9, the memory 34 and the address designation device 37 are used in common for the multichannels, contributing to the simplicity of the apparatus. If a multiplexer and a demultiplexer are arranged on the multichannels, a single digital multiplier may be employed in the time division manner.

Figure 1:
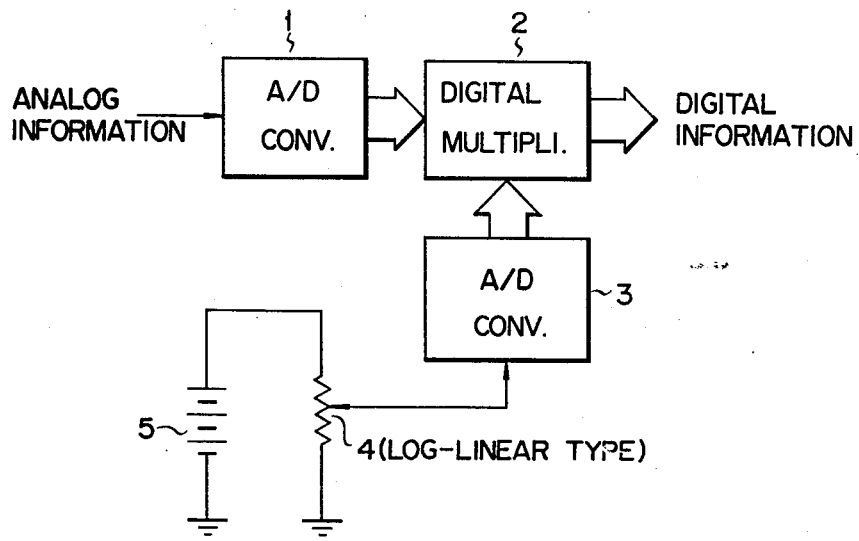
FIG. 1 shows a prior art digital amplitude control adjusting apparatus.
Figure 10:
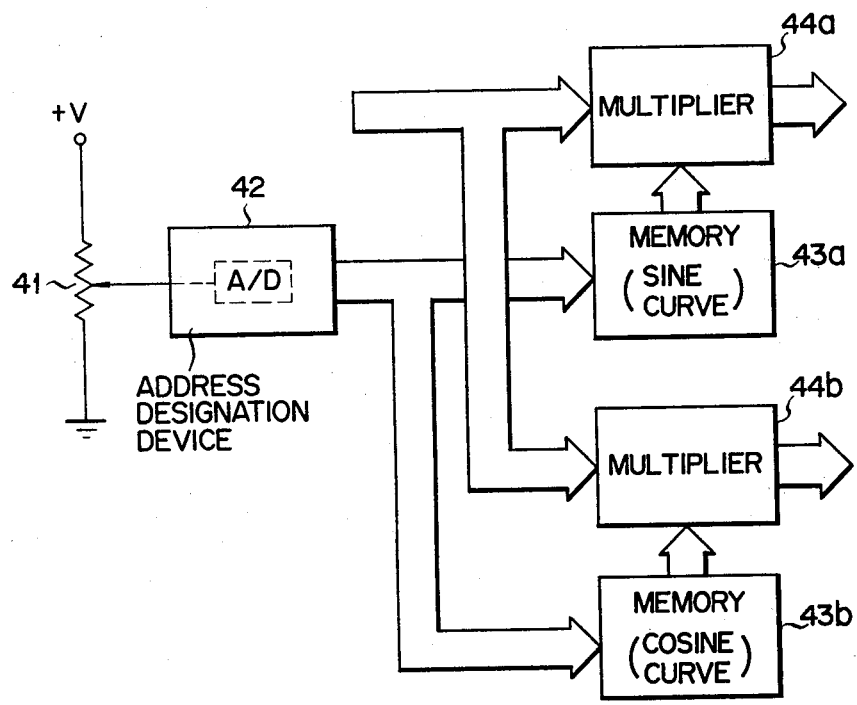
FIG. 10 shows a digital pan-pot constructed according to the invention.

The pan-pot used in the digital signal process circuit 33 may be embodied as shown in FIG. 10. Formed of two interlocking potentiometers with sine- and cosine-curve characteristics and two high accuracy A/D converters as shown in FIG. 1, a conventional digital pan-pot has been highly expensive. According to this invention, however, the digital pan-pot may be formed of a single linear potentiometer and a cheap A/D converter. That is, as shown in FIG. 10, the potential of slider of a potentiometer 41 is applied to an address designation device 42 which is comprised of an A/D converter. The slider potential is converted by the address designation device 42 into address information which is applied in common to a pair of memories 43a and 43b. The memories 43a and 43b store digital amplitude control information values with the sine- and cosine-curve characteristics, respectively. Locations of the memories 43a and 43b having the same address store sine and cosine values in accordance with the manipulated variable of the potentiometer 41. Amplitude control information values from the memories 43a and 43b are applied respectively to digital multipliers 44a and 44b which receive the digital audio information in common. According to such an arrangement, the audio information applied to the multiplier 44a is amplitude-controlled according to the sine curve, while the audio information applied to the multiplier 44b is amplitude-controlled according to the cosine curve.

Although the above-mentioned embodiments of this invention are so constructed as to provide a digital memory control signal which is substantially linearly related to the manipulated variable of the slider of the linear potentiometer by means of the potentiometer and A/D converter, a digital memory control signal corresponding to e.g. the operating position of a lever may be provided by using mechanical multicontacts or optical methods. Namely, the digital signal can be directly obtained without employing an A/D converter.

What we claim is:

1. A digital amplitude control apparatus for a digital audio input signal comprising: a manipulatable digital signal generating means for producing a digital signal which is substantially linearly related to a manipulated variable to control the amplitude of the digital audio input signal; memory means storing a series of digital amplitude control values with predetermined amplitude changing characteristics in memory locations, and connected to receive as an address signal the digital signal from said digital signal generating means so as to read out a stored digital amplitude control value from one of said memory locations designated by the address signal; and digital multiplier means multiplying the digital audio input signal to be amplitude-controlled by the digital amplitude control value from said memory means.

2. An apparatus according to claim 1, wherein said digital signal generating means includes a potentiometer connected across a DC voltage source for taking out a DC output voltage signal substantially linearly related to a displacement amount of a slider of said potentiometer, and an analog-to-digital converter for converting the DC output signal of said potentiometer into a digital signal.

3. An apparatus according to claim 2, wherein said digital signal generating means further includes a digital-to-analog converter for converting the digital signal of said analog-to-digital converter into an analog signal, a level shift circuit connected to receive the analog signal of said digital-to-analog converter to produce first and second output signals, said first and second output signals being higher and lower in voltage level than the output signal of said digital-to-analog converter respectively, and a voltage comparator circuit for comparing the output signal of said potentiometer with the first and second output signals of said level shift circuit, said analog-to-digital converter being responsive to said comparator circuit to effect the analog-to-digital conversion of the output signal of said potentiometer when the output signal of said potentiometer becomes higher in voltage level than the first output signal of said level shift circuit or lower than the second output signal.

4. An apparatus according to claim 3, wherein said digital signal generating means further includes a sample and hold circuit connected between said analog-to-digital converter and said potentiometer.

5. An apparatus according to claim 2, wherein said digital signal generating means further includes a sample and hold circuit connected to receive the output signal of said potentiometer, a level shift circuit connected to receive the output signal of said sample and hold circuit to produce first and second output signals, said first and second output signals being higher and lower in voltage level than the output signal of said sample and hold circuit respectively, and a voltage comparator circuit for comparing the output signals of said potentiometer with the first and second output signals of said level shift circuit, said sample and hold circuit and said analog-to-digital converter being responsive to said comparator to sample and convert the output signal of said potentiometer when the output signal of said potentiometer becomes higher in voltage level than the first output signal of said level shift circuit or lower than the second output signal.

6. An apparatus according to claim 5, wherein the output signal of said sample and hold circuit is applied to said analog-to-digital converter.

7. An apparatus according to claim 1, wherein said digital multiplier means includes first and second digital multipliers receiving in common the digital audio input signal to be amplitude controlled, and said memory means includes first and second memories receiving in common the digital audio input signal from said digital signal generating means, said first and second memories storing amplitude control values with different amplitude changing characteristics.

8. An apparatus according to claim 7, wherein said first memory stores amplitude control values with a sine-curve characteristic, and said second memory stores amplitude control values with a cosine-curve characteristic.

9. An apparatus according to claim 1, wherein the number of bits of the digital signal of said digital signal generating means is less than the bit number of the digital input audio signal to be amplitude-controlled.

* * * * *